US010580672B2

(12) United States Patent
Yang et al.

(10) Patent No.: US 10,580,672 B2
(45) Date of Patent: Mar. 3, 2020

(54) SYSTEMS AND METHODS FOR WORKPIECE PROCESSING

(71) Applicants: Mattson Technology, Inc., Fremont, CA (US); Beijing E-Town Semiconductor Technology, Co., LTD, Beijing (CN)

(72) Inventors: Michael Yang, Palo Alto, CA (US); Ryan Pakulski, Discovery Bay, CA (US)

(73) Assignees: MATTSON TECHNOLOGY, INC., Fremont, CA (US); BEIJING E-TOWN SEMICONDUCTOR TECHNOLOGY, CO., LTD, Beijing (CN)

(*) Notice: Subject to any disclaimer, the term of this patent is extended or adjusted under 35 U.S.C. 154(b) by 4 days.

(21) Appl. No.: 15/726,437

(22) Filed: Oct. 6, 2017

(65) Prior Publication Data

US 2018/0108548 A1 Apr. 19, 2018

Related U.S. Application Data

(60) Provisional application No. 62/409,538, filed on Oct. 18, 2016.

(51) Int. Cl.
*H01L 21/67* (2006.01)
*H01L 21/677* (2006.01)

(52) U.S. Cl.
CPC .. *H01L 21/67167* (2013.01); *H01L 21/67201* (2013.01); *H01L 21/67742* (2013.01)

(58) Field of Classification Search
CPC ......... H01L 21/67167; H01L 21/67196; H01L 21/67201; H01L 21/67742;
(Continued)

(56) References Cited

U.S. PATENT DOCUMENTS 5,376,862 A 12/1994 Stevens
6,450,750 B1 * 9/2002 Heyder ............ H01L 21/67778 414/217
(Continued)

FOREIGN PATENT DOCUMENTS

EP 1684951 5/2014
WO WO-2015057959 A1 * 4/2015 ....... H01L 21/67173

OTHER PUBLICATIONS

International Preliminary Report on Patentability for corresponding PCT Application No. PCT/2017/055460, dated Apr. 23, 2019—16 pages.

*Primary Examiner* — Glenn F Myers
(74) *Attorney, Agent, or Firm* — Dority & Manning, P.A.

(57) ABSTRACT

Systems and methods for processing workpieces, such as semiconductor workpieces are provided. One example embodiment is directed to a processing system for processing a plurality of workpieces. The plasma processing system can include a loadlock chamber. The loadlock chamber can include a workpiece column configured to support a plurality of workpieces in a stacked arrangement. The system can further include at least two process chambers. The at least two process chambers can have at least two processing stations. Each processing station can have a workpiece support for supporting a workpiece during processing in the process chamber. The system further includes a transfer chamber in process flow communication with the loadlock chamber and the process chamber. The transfer chamber includes a rotary robot. The rotary robot can be configured to transfer a plurality of workpieces from the stacked arrangement in the loadlock chamber to the at least two processing stations.

12 Claims, 10 Drawing Sheets

162 160 124 150 134 120 152 154 130 122 132 158 156 110 112

(58) Field of Classification Search
CPC ......... H01L 21/67161; H01L 21/67184; H01L 21/68707
See application file for complete search history.

(56) References Cited

U.S. PATENT DOCUMENTS

| | | | | |
|---|---|---|---|---|
| 7,959,403 | B2 * | 6/2011 | van der Meulen | B25J 9/042 414/217 |
| 8,430,620 | B1 * | 4/2013 | Blank | H01L 21/67742 414/217 |
| 9,202,733 | B2 | 12/2015 | Hosek | |
| 10,204,810 | B2 * | 2/2019 | Hoey | H01L 21/67173 |
| 2001/0016157 | A1 * | 8/2001 | Sundar | H01L 21/67167 414/217 |
| 2003/0123971 | A1 * | 7/2003 | Koyama | B25J 9/023 414/436 |
| 2005/0005847 | A1 | 1/2005 | Hiroki | |
| 2006/0039781 | A1 | 2/2006 | Niewmierzycki et al. | |
| 2006/0045664 | A1 | 3/2006 | Niewmierzycki et al. | |
| 2006/0182529 | A1 | 8/2006 | Hiroki | |
| 2008/0008569 | A1 * | 1/2008 | Seol | H01L 21/67742 414/287 |
| 2008/0105201 | A1 * | 5/2008 | Ronan | H01L 21/68742 118/500 |
| 2008/0175694 | A1 * | 7/2008 | Park | H01L 21/67742 414/217.1 |
| 2009/0191030 | A1 | 7/2009 | Bluck et al. | |
| 2013/0135784 | A1 | 5/2013 | Kao et al. | |
| 2014/0271054 | A1 * | 9/2014 | Weaver | H01L 21/67201 414/217.1 |
| 2015/0098790 | A1 * | 4/2015 | Wakabayashi | H01L 21/67742 414/805 |
| 2016/0293467 | A1 * | 10/2016 | Caveney | H01L 21/67173 |
| 2017/0057094 | A1 * | 3/2017 | Nishino | C23C 16/52 |
| 2018/0082881 | A1 * | 3/2018 | Nagakubo | H01L 21/68707 |
| 2018/0166295 | A1 * | 6/2018 | Huang | H01L 21/033 |

* cited by examiner

SYSTEMS AND METHODS FOR WORKPIECE PROCESSING

FIELD

The present disclosure relates generally to processing workpieces and more particularly to systems for processing workpieces, such as semiconductor workpieces.

BACKGROUND

Processing systems which expose workpieces such as, semiconductor wafers or other suitable substrates, to an overall treatment regimen for forming semiconductor devices or other devices can perform a plurality of treatment steps, such as plasma processing (e.g., strip, etch, etc.), thermal treatment (e.g. annealing), deposition (e.g., chemical vapor deposition), etc. To carry out these treatment steps, a system may include one or more robots to move workpieces a number of different times, for example, into the system, between various processing chambers, and out of the system. An important consideration in any semiconductor processing system is footprint size of the system. Increased footprint size can take up more space in processing facilities, leading to reduced throughput and increased costs.

Example configurations of processing systems for semiconductor workpieces can include cluster-style tools, carousel-style tools, etc. In cluster-style tools, a plurality of semiconductor processing modules can be arranged around a central robot for moving workpieces among the plurality of processing chambers. Cluster-style tools can have a large footprint (e.g., take up a large amount of space) and can only support a limited number of processing chambers. In carousel-style tools, workpieces can be rotated among a plurality of process stations. Carousel-style tools can suffer from reduced process integration flexibility and can be difficult to implement in conjunction with cluster configurations.

SUMMARY

Aspects and advantages of embodiments of the present disclosure will be set forth in part in the following description, or may be learned from the description, or may be learned through practice of the embodiments.

One example aspect of the present disclosure is directed to a processing system for processing a plurality of workpieces. The processing system can include at loadlock chamber. The loadlock chamber can include a workpiece column configured to support a plurality of workpieces in a stacked arrangement. The system can further include at least one process chamber, such as two process chambers. The at least one process chamber can have at least two processing stations. Each processing station can have a workpiece support for supporting a workpiece during processing in the process chamber. The system further includes a transfer chamber in process flow communication with the loadlock chamber and the at least one process chamber. The transfer chamber includes a rotary robot. The rotary robot can be configured to transfer a plurality of workpieces from the stacked arrangement in the loadlock chamber to the at least two processing stations in the process chamber.

Other example aspects of the present disclosure are directed to systems, methods, and apparatus for processing semiconductor workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
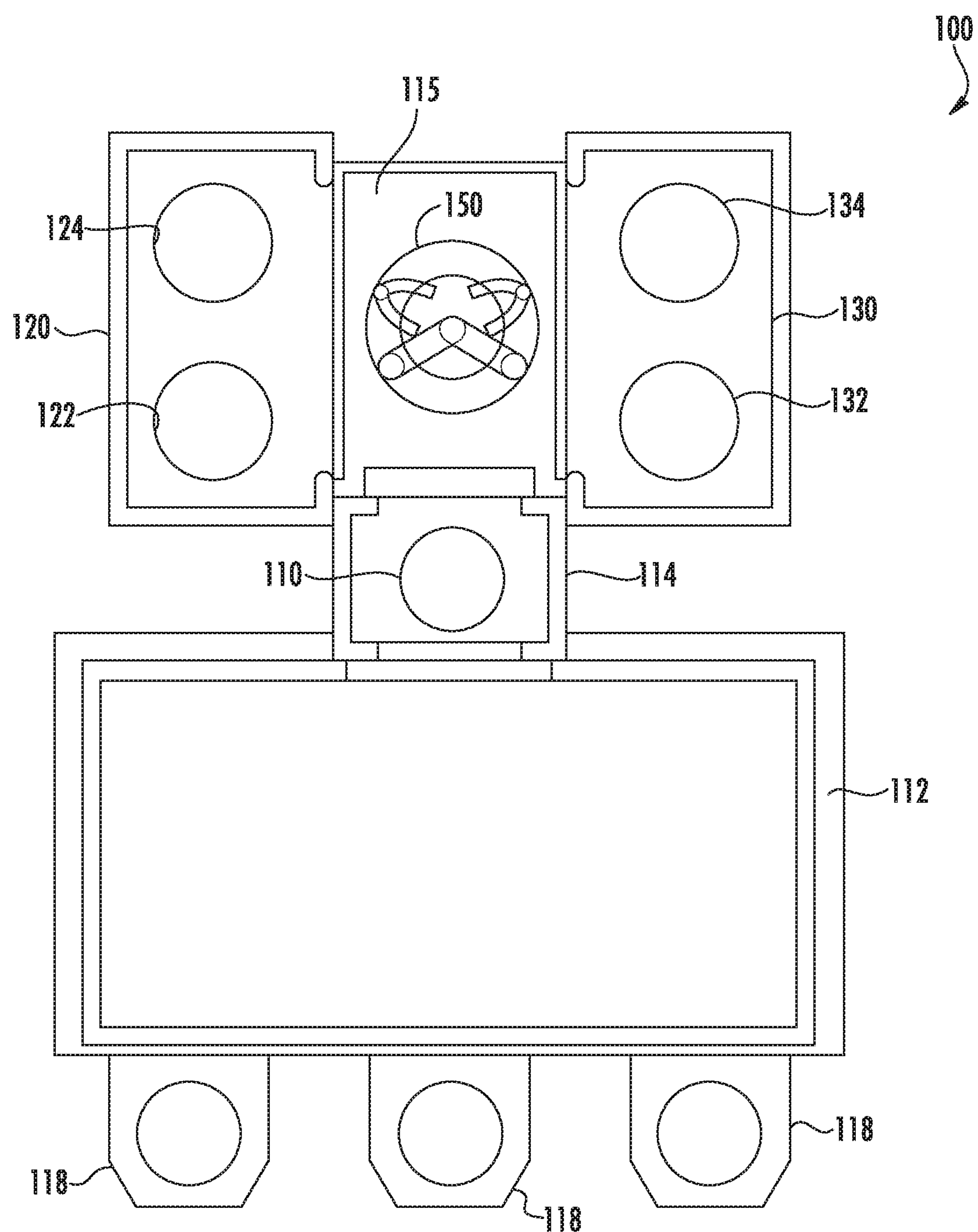
FIG. 1 depicts a plan view of an example processing system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to systems for processing workpieces, such as semiconductor workpieces, opto-electronic workpieces, flat panel displays, or other suitable workpieces. The workpiece materials can include, for instance, silicon, silicon germanium, glass, plastic, or other suitable material. In some embodiments, the workpieces can be semiconductor wafers. The system can be used to implement a variety of workpiece manufacturing processes, including, but not limited to vacuum anneal processes, surface treatment processes, dry strip processes, dry etch processes, deposition processes, and other processes.

More particularly, the system can include a plurality of process chambers for processing the workpiece. Each process chamber can include a plurality of processing stations (e.g., two processing stations in a twin architecture) using a common process pressure (e.g., vacuum) environment. In some embodiments, one or more of the process chambers can be plasma process chambers having plasma based process sources, such as inductively coupled plasma sources, microwave sources, surface wave plasma sources, ECR plasma sources, capacitively coupled (e.g., parallel plate) plasma sources, etc.

In example embodiments, the processing system can include a loadlock chamber. The loadlock chamber can be configured to subject the workpieces to processing pressure (e.g., vacuum pressure) prior to transferring the workpieces to a process chamber. The loadlock chamber can include a workpiece column having a plurality of shelves to hold workpieces in a stacked arrangement. The system can further include a transfer chamber for transferring workpieces from the loadlock chamber to a process chamber and/or for transferring workpieces among different process chambers. In some embodiments, the transfer chamber can be maintained at a vacuum pressure or other suitable process pressure. The transfer chamber can be disposed in process flow communication between the loadlock chamber and at least one process chamber.

According to example embodiments of the present disclosure, the transfer chamber can include a rotary robot. A rotary robot can include a robot primarily configured to transfer workpieces by rotating about an axis at a fixed point or area. The rotary robot can be configured to transfer a plurality of workpieces (e.g., two workpieces) from the workpiece column in the loadlock chamber to two or more processing stations in the process chamber. Each processing station can include a workpiece support for supporting the workpiece during processing. In some embodiments, the rotary robot can transfer the plurality of workpieces using a scissor motion, for instance, that simultaneously delivers workpieces to the two or more processing stations in the process chamber. As used herein, a scissor motion refers to the movement of two or more robot arms similar to the opening or closing of scissors. For instance, in one example scissor motion, first ends of the robot arms separate faster from one another than opposing second ends of the robot arms. In another example scissor motion, first ends of the robot arms separate from one another while the second ends or other portions of the robot arms remained in a fixed position.

In one example implementation, the rotary robot can include a plurality of robot arms configured to rotate about a fixed pivot point. Each robot arm can be associated with one or more workpiece blades. Each workpiece blade can have an endeffector configured to support a workpiece. The rotary robot can be configured to control the plurality of robot arms to transfer workpieces from the workpiece column to the at least two processing stations in a process chamber using a scissor motion where the plurality of robot arms separate from one another to transfer the workpiece blades to the processing stations.

In another example implementation, the rotary robot can include a single primary arm that rotates about a pivot point or pivot area. The single primary arm can be coupled to a plurality of secondary arms. The secondary arms can each be coupled to at least one workpiece blade. Each workpiece blade can include an endeffector for supporting a workpiece. In some embodiments, the rotary robot can be configured to transfer at least two workpieces from the workpiece column in the loadlock chamber to two processing stations in the process chamber using a scissor motion. During the scissor motion, the secondary arms can separate in a scissor like fashion so that the workpiece blade associated with one of the secondary arms transfers a workpiece to a first processing station and so that the workpiece blade associated with another of the secondary arms transfers a workpiece to the second processing station.

In some embodiments, the single primary arm and scissor motion of the secondary arms can be operated using a single motor. In some embodiments, the rotary robot can have a second primary arm coupled to a plurality of secondary arms. The second primary arm can be operated in a manner similar to the other primary arm for purposes of, for instance, workpiece swap. In some embodiments, the primary arms may not be operated at the same time so that operation of both primary arms can be controlled using a single motor.

In some embodiments, the processing system can include a plurality of process chambers. Each process chamber can include at least two processing stations. The rotary robot in the transfer chamber can transfer workpieces among the plurality of process chambers and the loadlock chamber.

For instance, in one example implementation, the processing system can include two process chambers, including a first process chamber and a second process chamber. The first process chamber and the second process chamber can be disposed on opposite sides of the transfer chamber. The rotary robot can be configured to transfer a plurality of workpieces from the workpiece column in the loadlock chamber to the two or more processing stations of the first process chamber and/or the two or more processing stations of the second process chamber (e.g., using a scissor motion). In addition, the rotary robot can be configured to transfer a plurality of workpieces from the two or more processing stations of the first process chamber to the two or more processing stations of the second process chamber.

In another implementation, the processing system can include four process chambers, including a first process chamber, a second process chamber, a third process chamber, and a fourth process chamber. The first process chamber and the second process chamber can be disposed on opposite sides of the transfer chamber. The third process chamber can be disposed in a linear arrangement with the first process chamber. The fourth process chamber can be disposed in a linear arrangement with a second process chamber such that the third process chamber and the fourth process chamber are disposed on opposite sides of the transfer chamber.

In this particular implementation, the system can include two rotary robots in the transfer chamber, including a first rotary robot and a second rotary robot. The system can further include a transfer position between the first rotary robot and the second rotary robot. The transfer position can allow the first rotary robot (e.g., the rotary robot with access to the loadlock chamber) to transfer workpieces to the second rotary robot. The transfer position can include a workpiece column configured to support a plurality of workpieces in a stacked arrangement (e.g., on a plurality of shelves).

The first rotary robot can be configured to transfer a plurality of workpieces from the workpiece column in the loadlock chamber to two or more processing stations of the first process chamber and/or the two or more processing stations of the second process chamber and/or to the workpiece column in the transfer position. In addition, the first rotary robot can be configured to transfer a plurality of workpieces among the two or more processing stations of the first process chamber, the two or more processing stations of the second process chamber, and the workpiece column of the transfer position.

The second rotary robot can be configured to transfer a plurality of workpieces from the workpiece column in the transfer chamber to the two or more processing stations of the third process chamber and/or the two or more processing stations of the fourth process chamber. In addition, the second rotary robot can be configured to transfer a plurality of workpieces among the two or more processing stations of the third process chamber, the two or more processing stations of the fourth process chamber, and the workpiece column of the transfer position.

The processing system can be further extended to include more processing chambers by adding transfer positions, rotary robots and process chambers in linear fashion to provide any number of process chambers for performing workpiece treatments. In this way, multiple process modules can be integrated on the proposed system without vacuum or process pressure break, enabling multiple process integration schemes including combination of dry etch and dry strip processes, surface pre-clean/treatment followed by film deposition process, and consecutive film deposition processes, etc. Furthermore, in the proposed system architecture, workpieces can be swapped back and forth between two types of process chambers configured at opposite sides of each rotary vacuum robot, enabling a unique cyclic process capability (e.g., such as atomic layer etch processes).

The processing system according to example embodiments of the present disclosure can provide for a high productivity system with a small footprint. The footprint can be smaller relative to footprints associated with cluster-style tools. In addition, the processing system can process multiple workpieces (e.g., 4 workpieces, 8 workpieces, or more) with a significant improvement in processing system efficiency metrics, such as footprint/throughput, cost/throughput, and other metrics.

One example embodiment of the present disclosure is directed to a processing system for processing a plurality of workpieces. The processing system includes a loadlock chamber. The loadlock chamber can include workpiece column configured to support a plurality of workpieces in a stacked arrangement. The processing system includes at least two process chambers. The at least two process chambers have at least two processing stations. Each processing station associated with a workpiece support for supporting a workpiece during processing in the process chamber. The processing system includes a transfer chamber in process flow communication with the loadlock chamber and the at least two process chambers. The transfer chamber includes at least one rotary robot. The rotary robot has at least one arm configured to rotate about an axis. The rotary robot is configured to transfer a plurality of workpieces from the workpiece column in the loadlock chamber to the at least two processing stations in the at least two process chambers (e.g., using a scissor motion).

In some embodiments, the at least two process chambers include a first process chamber and a second process chamber, each of the first process chamber and the second process chamber comprising at least two process stations. The first process chamber and the second process chamber are disposed on opposing sides of the transfer chamber such that the rotary robot can transfer the plurality of workpieces among the first process chamber and the second process chamber.

In some embodiments, the first process chamber and the second process chamber are disposed in a linear arrangement. The system includes a transfer position configured to support a plurality of workpieces in a stacked arrangement. The rotary robot can be configured to transfer a plurality of workpieces from the at least two processing stations in the first process chamber to the stacked arrangement in the transfer position. A second rotary robot can be configured to transfer a plurality of workpieces from the stacked arrangement in the transfer position to the at least two processing stations in the second process chamber. The transfer position can be located in the transfer chamber In some embodiments, the at least two process chambers include a first process chamber and a second process chamber disposed on opposing sides of the transfer chamber. The at least two process chambers further include a third process chamber disposed in a linear arrangement with the first process chamber and a fourth process chamber disposed in a linear arrangement with the second process chamber such that the third process chamber and the fourth process chamber are disposed on opposing sides of the transfer chamber. Each of the first process chamber, second process chamber, third process chamber, and fourth process chamber can include at least two process stations.

In some embodiments, the system further includes a transfer position configured to support a plurality of workpieces in a stacked arrangement. The at least one rotary robot includes a first rotary robot configured to transfer a plurality of workpieces from the stacked arrangement in the loadlock chamber to the at least two processing stations in the first process chamber and a second rotary robot configured to transfer a plurality of workpieces from the stacked arrangement in the transfer position to the at least two processing stations in the third process chamber.

In some embodiments, the rotary robot has at least one primary arm configured to rotate about a pivot point. The primary arm can be coupled to a plurality of secondary arms. Each secondary arm can be associated with at least one workpiece blade configured to support one of the plurality of workpieces.

In some embodiments, the rotary robot can be configured to extend the arm and to scissor open the plurality of workpiece blades to transfer the plurality of workpieces to the at least two processing stations in the process chamber. In some embodiments, the rotary robot can be configured to extend the arm and to scissor open the plurality of workpiece blades using a single motor.

In some embodiments, the rotary robot includes a first arm having one or more workpiece blades and a second arm comprising one or more workpiece blades. The first arm can be configured to transfer one of the plurality of workpieces from the column in the loadlock chamber to a first processing station in the process chamber and the second arm can be configured to transfer one of the plurality of workpieces from the column in the loadlock chamber to a second processing station in the process chamber.

Another example aspect of the present disclosure is directed to a method for processing a workpiece in a semiconductor processing system. The method includes transferring a plurality of workpieces to a workpiece column in a loadlock chamber. The workpiece column configured to support a plurality of workpieces in a stacked arrangement. The method includes transferring, with a rotary robot located in a transfer chamber, the plurality of workpieces from the workpiece column to at least two processing stations in a first process chamber (e.g., using a scissor motion). The method includes performing a first treatment process on the plurality of workpieces in the first process chamber. The method includes transferring, with the rotary robot, the plurality of workpieces to at least two processing stations in a second process chamber. The method includes performing a second treatment process on the plurality of workpieces in the second process chamber. In some embodiments, the second treatment process is different from the first treatment process.

In some embodiments, the method can include transferring, with the rotary robot, the plurality of workpieces to a transfer position. The method can include transferring, with a second rotary robot disposed in the transfer chamber, the plurality of workpieces from the transfer position to at least two processing stations in a third process chamber. The third process chamber can be disposed in linear arrangement with the first process chamber. The method can include performing a third treatment process on the plurality of workpieces in the third process chamber. The method can include transferring, with the second rotary robot, the plurality of workpieces to at least two processing stations in a fourth process chamber. The fourth process chamber can be disposed in linear arrangement with the second process chamber. The method can include performing a fourth treatment process on the plurality of workpieces in the fourth process chamber.

Yet another example aspect of the present disclosure is directed to a processing system for processing workpieces. The system includes a workpiece column. The system includes a first rotary robot. The system includes a second rotary robot. The system includes a first process chamber. The system includes a second process chamber. The second process chamber disposed in linear arrangement with the first process chamber. The system includes a transfer station. The system includes a first rotary robot configured to transfer a workpiece from the workpiece column to the at least two processing stations in the first process chamber. The first rotary robot can be configured to transfer the workpiece from the first process chamber to the transfer position. The system includes a second rotary robot configured to transfer the workpiece from the transfer position to the second process chamber.

Variations and modifications can be made to these example embodiments of the present disclosure. As used in the specification, the singular forms "a," "and," and "the" include plural referents unless the context clearly dictates otherwise. The use of "first," "second," "third," and "fourth" are used as identifiers and are directed to an order of processing. Example aspects may be discussed with reference to a "substrate," "wafer," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

With reference now to the FIGS., example embodiments of the present disclosure will now be discussed in detail. FIG. 1 depicts a processing system 100 according to example embodiments of the present disclosure. The processing system 100 can include a front end portion 112, a loadlock chamber 114, a transfer chamber 115 and a plurality of process chambers, including a first process chamber 120 and a second process chamber 130.

The front end portion 112 can be configured to be maintained at atmospheric pressure and can be configured to engage workpiece input devices 118. The workpiece input devices 118 can include, for instance, cassettes, front opening unified pods, or other devices for supporting a plurality of workpieces. Workpiece input devices 118 can be used to provide preprocess workpieces to the processing system 100 or to receive post-process workpieces from the processing system 100.

The front end portion 112 can include one or more robots (not illustrated) for transferring workpieces from workpiece input devices 118 to, for instance, the loadlock chamber 114, such as to and from a workpiece column 110 located in the loadlock chamber 114. In one example, the robot in the front end portion 112 can transfer preprocess workpieces to the loadlock chamber 114 and can transfer post-process workpieces from the loadlock chamber 114 to one or more of the workpiece input devices 118. Any suitable robot for transferring workpieces can be used in the front end portion 112 without deviating from the scope of the present disclosure. Workpieces can be transferred to and or from the loadlock chamber 114 through a suitable slit, opening, or aperture.

The loadlock chamber 114 can include a workpiece column 110 configured to support a plurality of workpieces in a stacked arrangement. The workpiece column 110 can include, for instance, a plurality of shelves. Each shelf can be configured to support one or more workpieces. In one example implementation, the workpiece column 110 can include one or more shelves for supporting preprocess workpieces and one or more shelves for supporting post-process workpieces.

Figure 2:
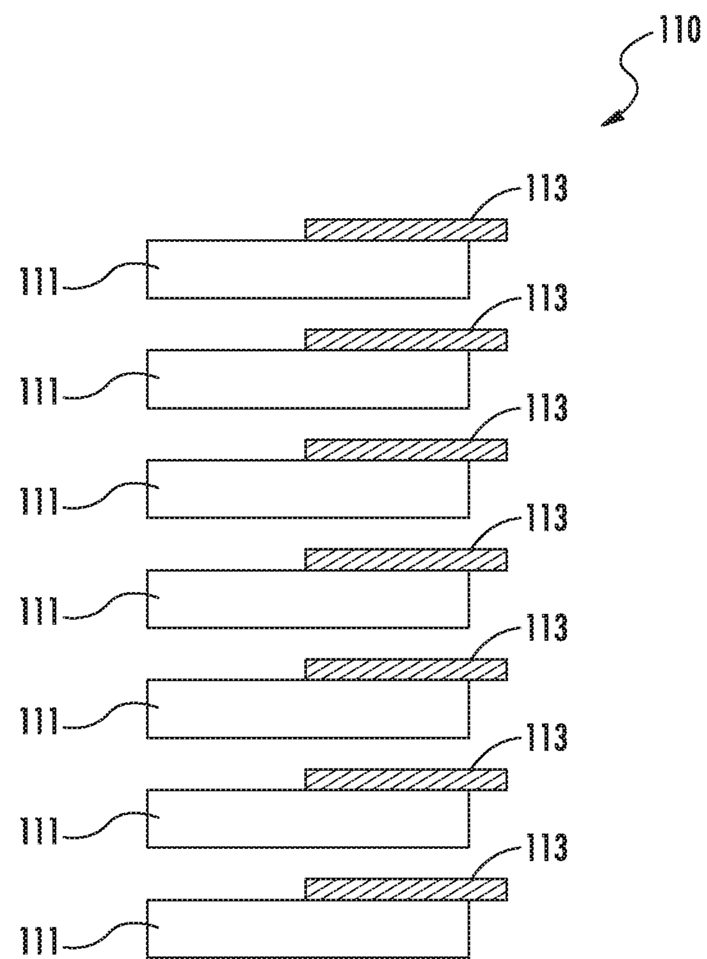
FIG. 2 depicts an example workpiece column according to example embodiments of the present disclosure.

FIG. 2 depicts a side view of an example workpiece column 110 according to example embodiments of the present disclosure. As shown, the workpiece column can include a plurality of shelves 111. Each shelf 111 can be configured to support a workpiece 113 so that a plurality of workpieces 113 can be arranged on the workpiece column 110 in a vertical/stacked arrangement.

Referring to FIG. 1, the loadlock chamber 114 can be used to adjust the pressure surrounding the workpieces from the pressure associated with the front end portion 112 to a process pressure, such as a vacuum or other process pressure, prior to transfer of the workpieces to process chambers, such as first process chamber 120 and/or second process chamber 130. In some embodiments, appropriate valves can be provided in conjunction with the loadlock chamber 114 and other chambers to appropriately adjust the process pressure for processing the workpieces. In some embodiments, the loadlock chamber 114 and the transfer chamber 115 can be maintained at the same pressure. In this embodiment, there is no need to seal the loadlock chamber 114 from the transfer chamber 115. Indeed, in some embodiments, the loadlock chamber 114 and the transfer chamber 115 can be a part of the same chamber.

The first process chamber 120 and the second process chamber 130 can be used to perform any of a variety of workpiece processing on the workpieces, such as vacuum anneal processes, surface treatment processes, dry strip processes, dry etch processes, deposition processes, and other processes. In some embodiments, one or more of the first process chamber 120 and the second process chamber 130 can include plasma based process sources such as, for example, inductively coupled plasma (ICP) sources, microwave sources, surface wave plasma sources, ECR plasma sources, and capacitively coupled (parallel plate) plasma sources.

As illustrated, each of the first process chamber 120 and second process chamber 130 includes a pair of processing stations in side-by-side arrangement so that the a pair of workpieces can be simultaneously exposed to the same process. More particularly, the first process chamber 120 can include a first processing station 122 and a second processing station 124 in side-by-side arrangement. The second process chamber 130 can include a first processing station 132 and a second processing station 134 in side-by-side arrangement. Each processing station can include a workpiece support (e.g., a pedestal) for supporting a workpiece during processing. In some embodiments, each processing station can share a common pedestal with two portions for supporting a workpiece. The first process chamber 120 and/or the second process chamber 130 can be selectively sealed off from the transfer chamber 115 for processing.

According to particular aspects of the present disclosure, the transfer chamber 115 can include a rotary robot 150. The rotary robot 150 can be configured to transfer workpieces from the workpiece column 110 in the loadlock chamber 112 to the processing stations in the first process chamber 120 and/or the second process chamber 130. The rotary robot 150 can also transfer workpieces between the first process chamber 120 and the second process chamber 130. For example, the rotary robot 150 can simultaneously transfer the workpieces from the workpiece column in the loadlock chamber 114 to the two side-by-side processing stations 122 and 124 in the first process chamber 120 using, for instance, a scissor motion. Similarly, the rotary robot 150 can simultaneously transfer workpieces from the workpiece column 110 in the loadlock chamber 112 to the two side-by-side processing stations 132 and 134 in the second process chamber 130 using, for instance, a scissor motion. Details concerning the operation of an example rotary robot 150 will be discussed with reference to FIGS. 7A to 7D and FIGS. 8A and 8B.

The rotary robot 150 can have a variety of configurations to support the transfer of workpieces according to example embodiments of the present disclosure. In one embodiment, the rotary robot 150 can include a pair of arms configured to rotate about a pivot point. Each robot arm can be associated with a pair of workpiece blades. Each workpiece blade can have an endeffector configured to support a workpiece. The pair of workpiece blades associated with each arm can be used to accomplish workpiece swap at the processing stations of the process chambers. The pair of arms can be configured to transfer workpieces to the two processing stations of each process chamber using a scissor motion.

In another example implementation, the rotary robot 150 can include at least one primary arm that rotates about a pivot point or pivot area. The primary arm can be coupled to a plurality of secondary arms. The secondary arms can each be coupled to at least one workpiece blade. Each workpiece blade can include an endeffector for supporting a workpiece. In some embodiments, the rotary robot 150 can be configured to transfer at least two workpieces from the workpiece column 110 in the loadlock chamber 112 to, for instance, two side-by-side processing stations 122 and 124 in first process chamber 120 using a scissor motion. In some embodiments, the scissor motion can be implemented using a single motor.

Figure 3:
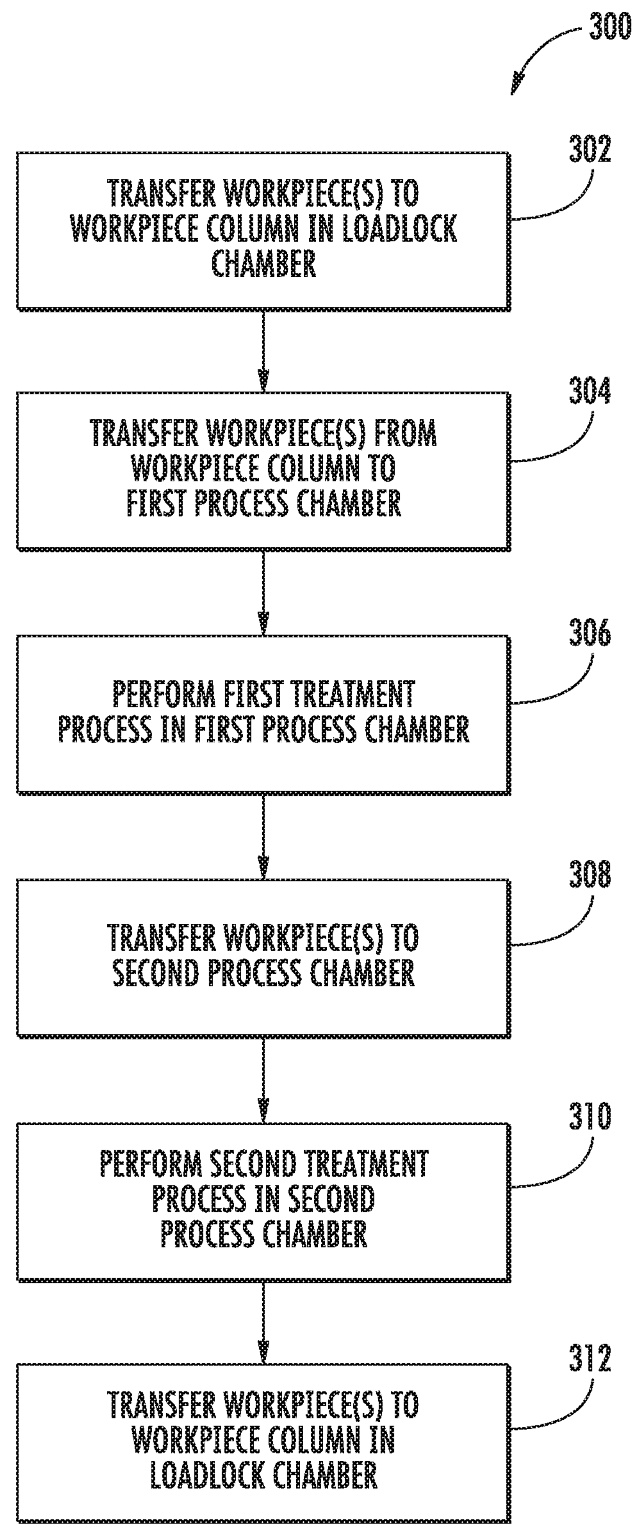
FIG. 3 depicts a flow diagram of an example processing method according to example embodiments of the present disclosure.

FIG. 3 depicts a flow diagram of an example method (300) for processing a workpiece in a processing system. The method (300) can be implemented using the processing system 100 of FIG. 1. FIG. 3 depicts steps performed in a particular order for purposes of illustration and discussion. Those of ordinary skill in the art, using the disclosures provided herein, will understand that various steps of any of the methods provided herein can be adapted, rearranged, performed simultaneously, omitted, and/or modified in various ways without deviating from the scope of the present disclosure.

At (302), the method includes transferring a plurality of workpieces to a workpiece column in a loadlock chamber. For instance, a plurality of workpieces can be transferred from a front end portion of processing chamber 100 to a workpiece column 110 in a loadlock chamber 114. The workpieces can be transferred to the workpiece column 110, for instance, using one or more robots associated with the front end portion of the processing chamber 100.

At (304), the method includes transferring, with a rotary robot located in a transfer chamber, the plurality of workpieces from the workpiece column to at least two processing stations in a first process chamber. For instance, rotary robot 150 can transfer two workpieces to processing station 122 and processing station 124 respectively in process chamber 120. In some embodiments, the rotary robot 150 can transfer workpieces to processing station 122 and processing station 124 in process chamber 120 using a scissor motion.

At (306), the method includes performing a first treatment process on the plurality of workpieces in the first process chamber. The first treatment process can include, for instance, an anneal process, a thermal treatment process, a surface treatment process, a dry strip processes, a dry etch process, a deposition process or other process.

At (308), the method includes transferring, with the rotary robot, the plurality of workpieces to at least two processing stations in a second process chamber. For instance, rotary robot 150 can transfer two workpieces to processing station 132 and processing station 134 respectively in process chamber 130. In some embodiments, the rotary robot 150 can transfer workpieces to processing station 132 and processing station 134 in process chamber 130 using a scissor motion.

In some embodiments, the rotary robot can transfer the plurality of workpieces to at least two processing stations in the second process chamber from the first process chamber. In some embodiments, the rotary robot can transfer the plurality of workpieces to at least two processing stations in the second process chamber from, for instance, a transfer position as discussed in detail below (e.g., from a workpiece column in a transfer position).

At (310), the method includes performing a second treatment process on the plurality of workpieces in the second process chamber. The second treatment process can include, for instance, an anneal process, a thermal treatment process, a surface treatment process, a dry strip processes, a dry etch process, a deposition process or other process. In some embodiments, the second treatment process can be the same as or different from the first treatment process.

At (312), the method can include transferring the processed workpieces back to the workpiece column in the loadlock chamber. For instance, rotary robot 150 can transfer two workpieces from the first process chamber 120 and/or the second process chamber 130. One or more robots located in a front end of the processing system can then transfer to processed workpieces to, for instance, a cassette.

According to particular aspects of the present disclosure, additional process chambers can be added to the processing system in linear fashion to provide the capability to process additional workpieces. For instance, FIG. 4 depicts an example processing system 200 with four process chambers according to example embodiments of the present disclosure.

Figure 4:
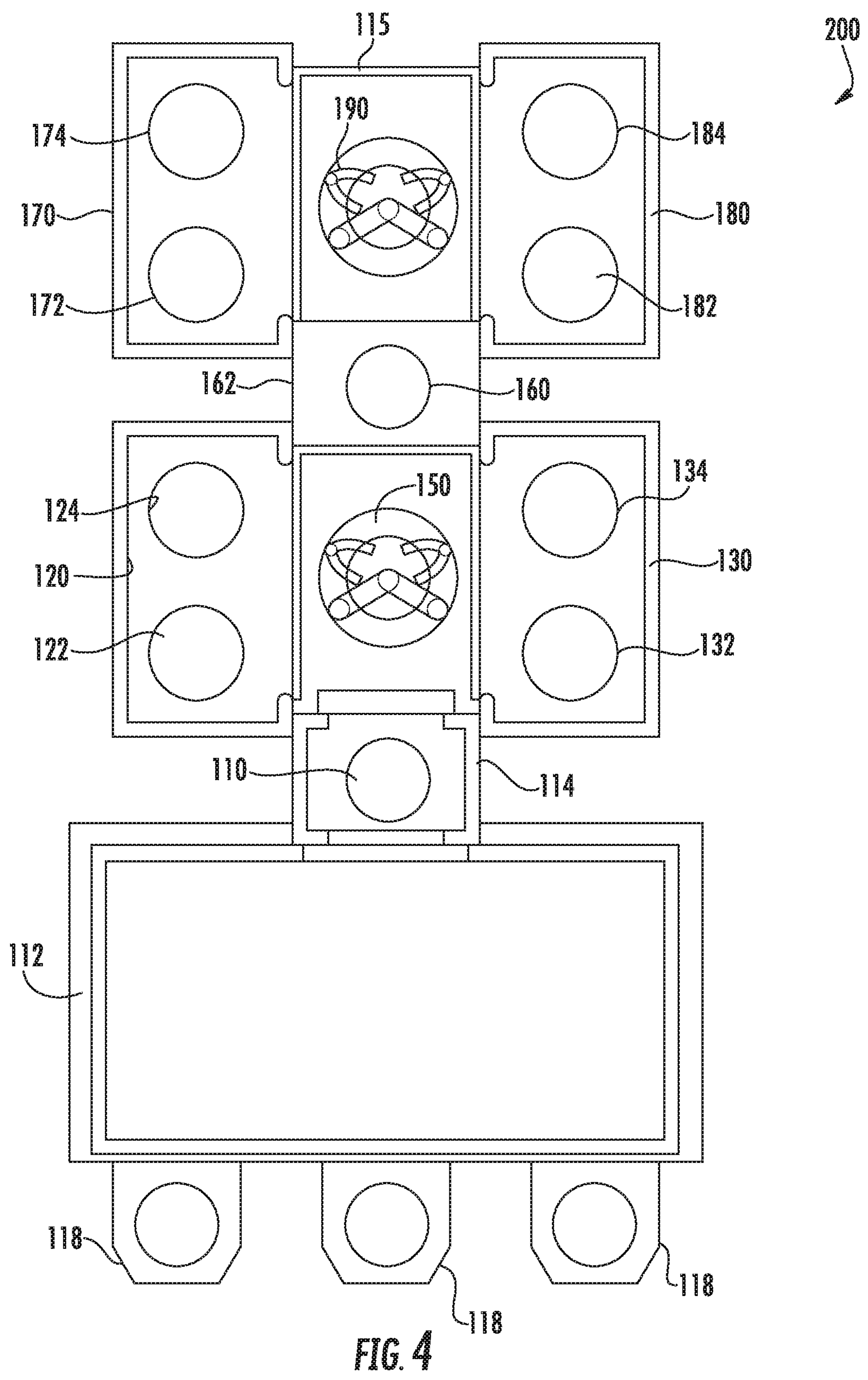
FIG. 4 depicts a plan view of an example processing system according to example embodiments of the present disclosure.

Similar to the processing system of FIG. 1, the processing system 200 of FIG. 4 can include a front end portion 112, a loadlock chamber 114, a transfer chamber 115 and a plurality of process chambers, including a first process chamber 120 and a second process chamber 130. The system can include a first rotary robot 150 for transferring workpieces to and from the workpiece column 110 in the loadlock chamber and the first process chamber 120 and second process chamber 130 and/or between the first process chamber 120 and the second process chamber 130.

Additionally, the processing system 200 can include additional process chambers, including a third process chamber 170 and fourth process chamber 180. The third process chamber 170 is disposed in linear arrangement with the first process chamber 120 and the fourth process chamber 180 is disposed in linear arrangement with the second process chamber 130 such that the third process chamber 170 and the fourth process chamber 180 are disposed on opposing sides of the transfer chamber 115.

The third process chamber 170 and the fourth process chamber 180 can be used to perform any of a variety of workpiece processing on the workpieces, such as vacuum anneal processes, thermal treatment process, surface treatment processes, dry strip processes, dry etch processes, deposition processes, and other processes. In some embodiments, one or more of the third process chamber 170 and the fourth process chamber 180 can include plasma based process sources such as, for example, inductively coupled plasma (ICP) sources, microwave sources, surface wave plasma sources, ECR plasma sources, and capacitively coupled (parallel plate) plasma sources.

As illustrated, each of the third process chamber 170 and fourth process chamber 180 includes a pair of processing stations in side-by-side arrangement so that a pair of workpieces can be simultaneously exposed to the same process. More particularly, the third process chamber 170 can include a first processing station 172 and a second processing station 174 in side-by-side arrangement. The fourth process chamber 180 can include a first processing station 182 and a second processing station 184 in side-by-side arrangement. Each processing station can include a workpiece support (e.g., a pedestal) for supporting a workpiece during processing. In some embodiments, the third process chamber 170 and/or the fourth process chamber 180 can be selectively sealed off from the transfer chamber 115 for processing.

To transfer workpieces to the third process chamber 170 and second process chamber 180, the system 200 can further include a transfer position 162 and a second rotary robot 190. The transfer position 162 can be a part of the transfer chamber 162 or can be a separate chamber. The transfer position 162 can include a workpiece column 160 for supporting a plurality of workpieces in a stacked arrangement. For instance, the workpiece column 160 can include a plurality of shelves configured to support workpieces in a stacked vertical arrangement. The first rotary robot 150 can be configured to transfer workpieces from the workpiece column 110, the first process chamber 120, or the second process chamber 130 to the workpiece column 160 in the transfer position 162.

Figure 5:
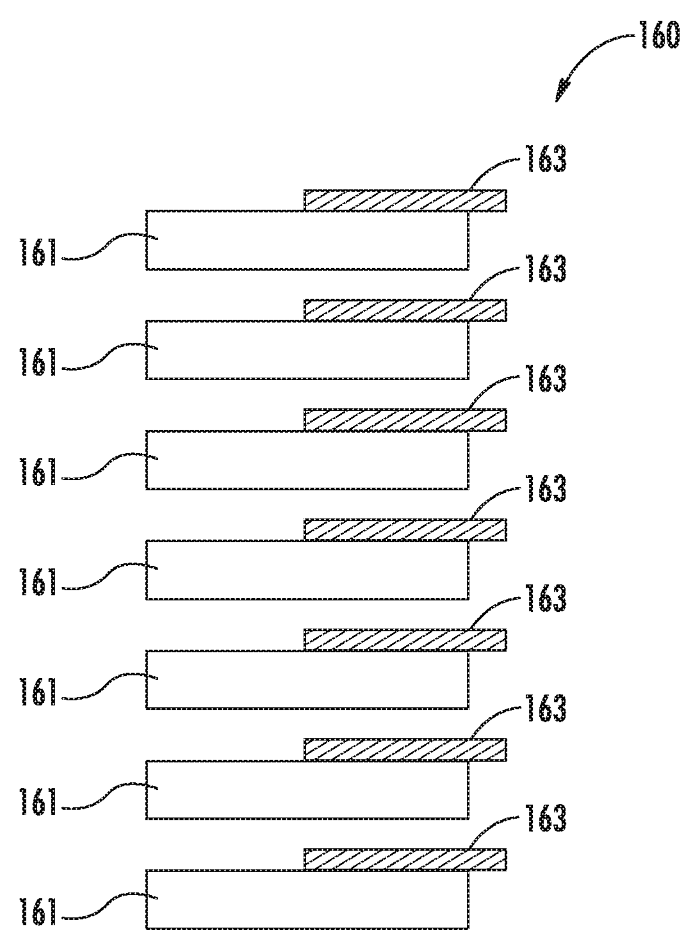
FIG. 5 depicts an example transfer position according to example embodiments of the present disclosure.

FIG. 5 depicts a side view of an example workpiece column 160 in a transfer position 162 according to example embodiments of the present disclosure. As shown, the workpiece column can include a plurality of shelves 161. Each shelf 161 can be configured to support a workpiece 163 so that a plurality of workpieces 163 can be arranged on the workpiece column 160 in a vertical/stacked arrangement.

A second rotary robot 190 can be configured to transfer workpieces from the workpiece column 160 in the transfer position 162 to the processing stations in the third process chamber 170 and/or the fourth process chamber 180. The rotary robot 190 can also transfer workpieces from the third process chamber 170 to the fourth process chamber 180. For example, the rotary robot 190 can simultaneously transfer the workpieces from the workpiece column 160 in the transfer to the two side-by-side processing stations 172 and 174 in the third process chamber 170 using, for instance, a scissor motion. Similarly, the rotary robot 190 can simultaneously transfer workpieces from the workpiece column 160 in the transfer position 162 to the two side-by-side processing stations 182 and 184 in the fourth process chamber 130 using, for instance, a scissor motion.

The rotary robot 190 can have a variety of configurations to support the transfer of workpieces according to example embodiments of the present disclosure. In one embodiment, the rotary robot 150 can include a pair of arms configured to rotate about a pivot point. Each robot arm can be associated with a pair of workpiece blades. Each workpiece blade can have an endeffector configured to support a workpiece. The pair of workpiece blades associated with each arm can be used to accomplish workpiece swap at the processing stations of the process chambers. The pair of arms can be configured to transfer workpieces to the two processing stations of each process chamber using a scissor motion.

In another example implementation, the rotary robot 190 can include at least one primary arm that rotates about a pivot point or pivot area. The primary arm can be coupled to a plurality of secondary arms. The secondary arms can each be coupled to at least one workpiece blade. Each workpiece blade can include an endeffector for supporting a workpiece. In some embodiments, the rotary robot 190 can be configured to transfer at least two workpieces from the workpiece column 160 in the transfer position 162 to, for instance, two side-by-side processing stations 172 and 174 in the third process chamber 170 using a scissor motion. In some embodiments, the scissor motion can be implemented using a single motor.

The processing system 200 includes four process chambers 120, 130, 170, and 180 and can be configured to simultaneously process up to eight workpieces at a time. Additional process stations can be added in linear fashion to provide additional processing capability. For instance, a fifth process chamber can be added in linear arrangement with the third process chamber 170. A sixth process chamber can be added in linear arrangement with the fourth process chamber 180. An additional transfer position and rotary robot can be used to transfer workpieces to and from the fifth and sixth process chambers. Additional processing chambers can be included by extending the processing system in linear fashion in this manner.

Figure 6A:
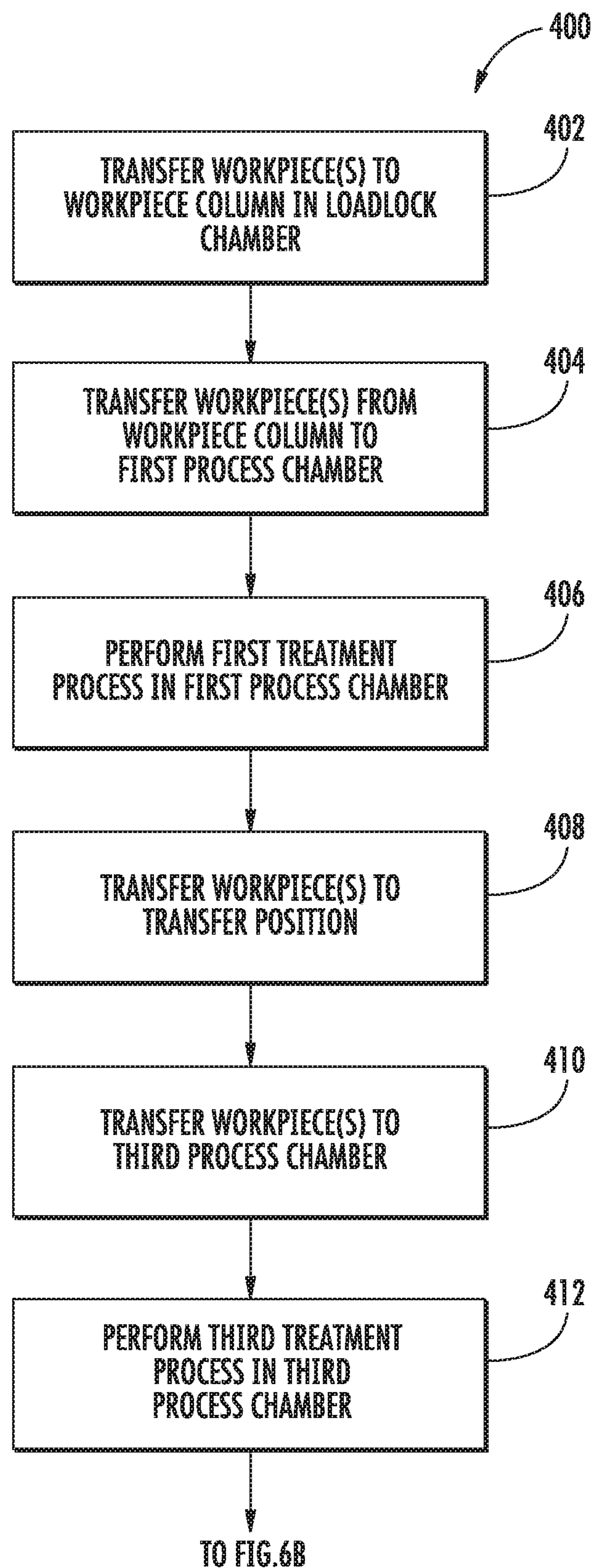
FIGS. 6A and 6B depict a flow diagram of an example processing method according to example embodiments of the present disclosure.
Figure 6B:
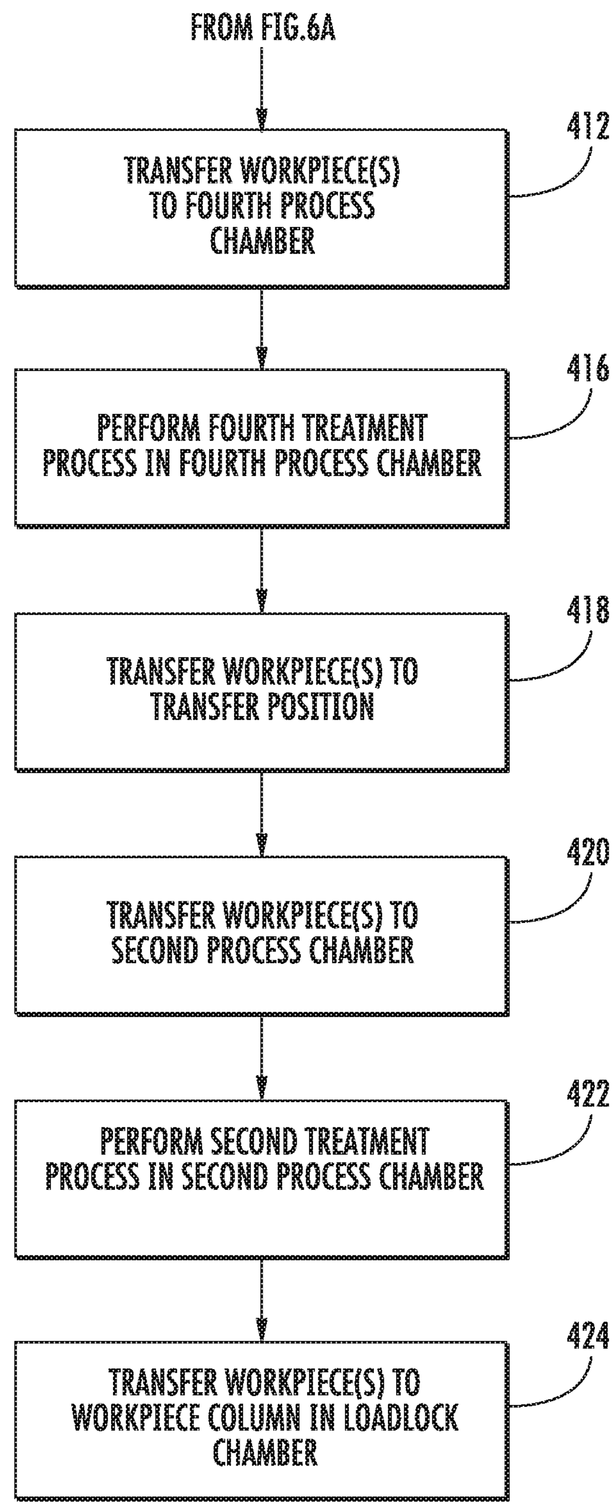

FIGS. 6A and 6B depict a flow diagram of an example method (400) for processing a workpiece in a processing system. The method (400) can be implemented using the processing system 200 of FIG. 4. FIGS. 6A and 6B depict steps performed in a particular order for purposes of illustration and discussion. Those of ordinary skill in the art, using the disclosures provided herein, will understand that various steps of any of the methods provided herein can be adapted, rearranged, performed simultaneously, omitted, and/or modified in various ways without deviating from the scope of the present disclosure.

At (402), the method includes transferring a plurality of workpieces to a workpiece column in a loadlock chamber. For instance, a plurality of workpieces can be transferred from a front end portion of processing chamber 100 to a workpiece column 110 in a loadlock chamber 114. The workpieces can be transferred to the workpiece column 110, for instance, using one or more robots associated with the front end portion of the processing chamber 100.

At (404), the method includes transferring, with a rotary robot located in a transfer chamber, the plurality of workpieces from the workpiece column to at least two processing stations in a first process chamber. For instance, rotary robot 150 can transfer two workpieces to processing station 122 and processing station 124 respectively in process chamber 120. In some embodiments, the rotary robot 150 can transfer workpieces to processing station 122 and processing station 124 in process chamber 120 using a scissor motion.

At (406), the method includes performing a first treatment process on the plurality of workpieces in the first process chamber. The first treatment process can include, for instance, an anneal process, a thermal treatment process, a surface treatment process, a dry strip processes, a dry etch process, a deposition process or other process.

At (408), the method can include transferring, with the rotary robot, the plurality of workpieces to a transfer position. Rotary robot 150 can transfer two workpieces to processing station 122 and processing station 124 respectively in process chamber 120. In some embodiments, the rotary robot 150 can transfer workpieces to a workpiece column 160 located at a transfer position 162.

At (410), the method can include transferring, with a second rotary robot disposed in the transfer chamber, the plurality of workpieces from the transfer position to at least two processing stations in a third process chamber. The third process chamber can be disposed in linear arrangement with the first process chamber. For instance, rotary robot 190 can transfer two workpieces from workpiece column 160 in the transfer position 162 to processing station 172 and processing station 174 respectively in process chamber 170. In some embodiments, the rotary robot 190 can transfer workpieces to processing station 172 and processing station 174 in process chamber 170 using a scissor motion.

At (412) the method can include performing a third treatment process on the plurality of workpieces in the third process chamber. The third treatment process can include, for instance, an anneal process, a thermal treatment process, a surface treatment process, a dry strip processes, a dry etch process, a deposition process or other process.

At (414), the method can include transferring, with the second rotary robot, the plurality of workpieces to at least two processing stations in a fourth process chamber. The fourth process chamber can be disposed in linear arrangement with the second process chamber. For instance, rotary robot 190 can transfer two workpieces from workpiece column 160 in the transfer position 162 to processing station 182 and processing station 184 respectively in process chamber 180. For instance, the rotary robot 190 can transfer workpieces to processing station 182 and processing station 184 in process chamber 180 using a scissor motion. In some embodiments, the rotary robot 190 can transfer two workpieces from the process chamber 170 to processing station 182 and processing station 184 in process chamber 180. For instance, the rotary robot 190 can transfer workpieces to processing station 182 and processing station 184 in process chamber 180 using a scissor motion At (416), the method can include performing a fourth treatment process on the plurality of workpieces in the fourth process chamber. The fourth treatment process can include, for instance, an anneal process, a thermal treatment process, a surface treatment process, a dry strip processes, a dry etch process, a deposition process or other process.

At (418), the method can include transferring, by the second rotary robot, the plurality of workpieces back to the transfer position. For instance, rotary robot 190 can transfer workpieces from the process chamber 170 and/or the process chamber 180 to a workpiece column 160 located at the transfer position 162.

At (422), the method includes transferring, with the rotary robot, the plurality of workpieces to at least two processing stations in a second process chamber. For instance, rotary robot 150 can transfer two workpieces to processing station 132 and processing station 134 respectively in process chamber 130. In some embodiments, the rotary robot 150 can transfer workpieces to processing station 132 and processing station 134 in process chamber 130 using a scissor motion.

In some embodiments, the rotary robot can transfer the plurality of workpieces to at least two processing stations in the second process chamber from the first process chamber 120. In some embodiments, the rotary robot can transfer the plurality of workpieces to at least two processing stations in the second process chamber 120 from, for instance, a workpiece column 160 located at a transfer position 162.

At (424), the method includes performing a second treatment process on the plurality of workpieces in the second process chamber. The second treatment process can include, for instance, an anneal process, a thermal treatment process, a surface treatment process, a dry strip processes, a dry etch process, a deposition process or other process. In some embodiments, the second treatment process can be the same as or different from the first treatment process, the third treatment process, and/or the fourth treatment process.

At (426), the method can include transferring the processed workpieces back to the workpiece column in the loadlock chamber. For instance, rotary robot 150 can transfer two workpieces from the first process chamber 120 and/or the second process chamber 130. One or more robots located in a front end of the processing system can then transfer to processed workpieces to, for instance, a cassette.

Referring to FIGS. 7A to 7D, the operation of an example a rotary robot 150 according to an example embodiment will be set forth. The rotary robot 150 of FIGS. 7A-7D includes two primary robot arms 152 and 154 configured to rotate about a fixed point. Each of the robot arms 152 and 154 can include at least one workpiece blade. For instance, robot arm 152 can include workpiece blade 156. Robot arm 154 can include workpiece blade 158. Each workpiece blade 156 and 158 can be configured to grab, hold, and release a workpiece using, for instance, a suitable endeffector. In some embodiments, each of the robot arms 152 and 154 can include a pair of workpiece blades. The additional workpiece blades can be used, for instance, for workpiece swap. Each of the robot arms 152 and 154 can be independently operated using, for instance, a motor.

Figure 7A:
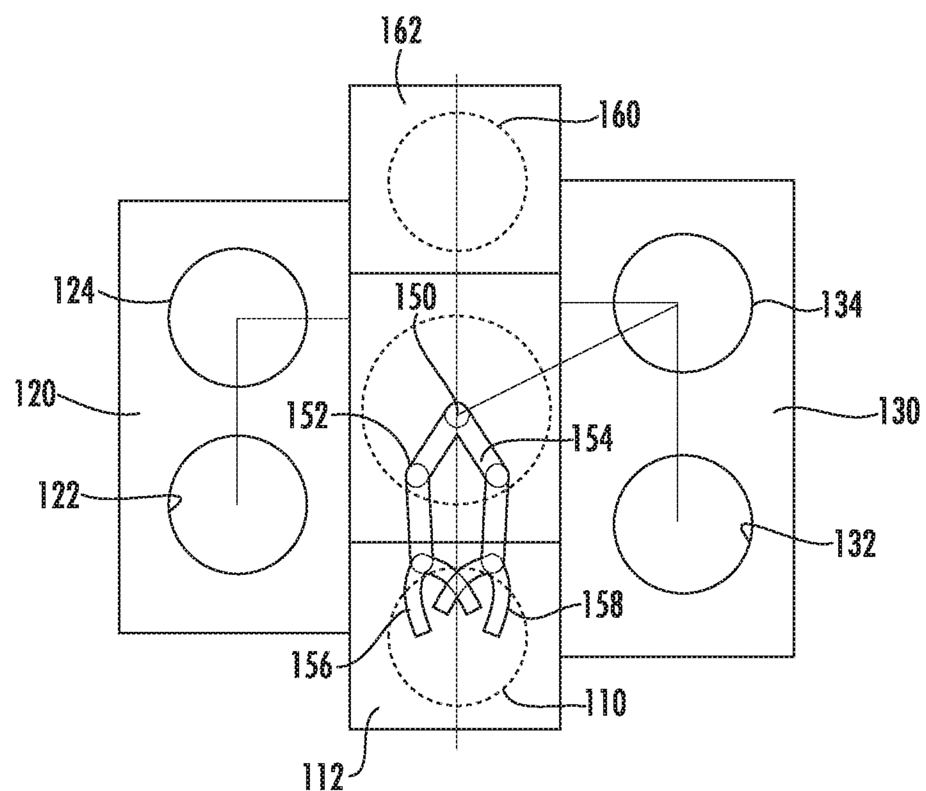
FIGS. 7A, 7B, 7C, and 7D depict the example transfer of workpieces in a processing system according to example embodiments of the present disclosure.
Figure 7B:
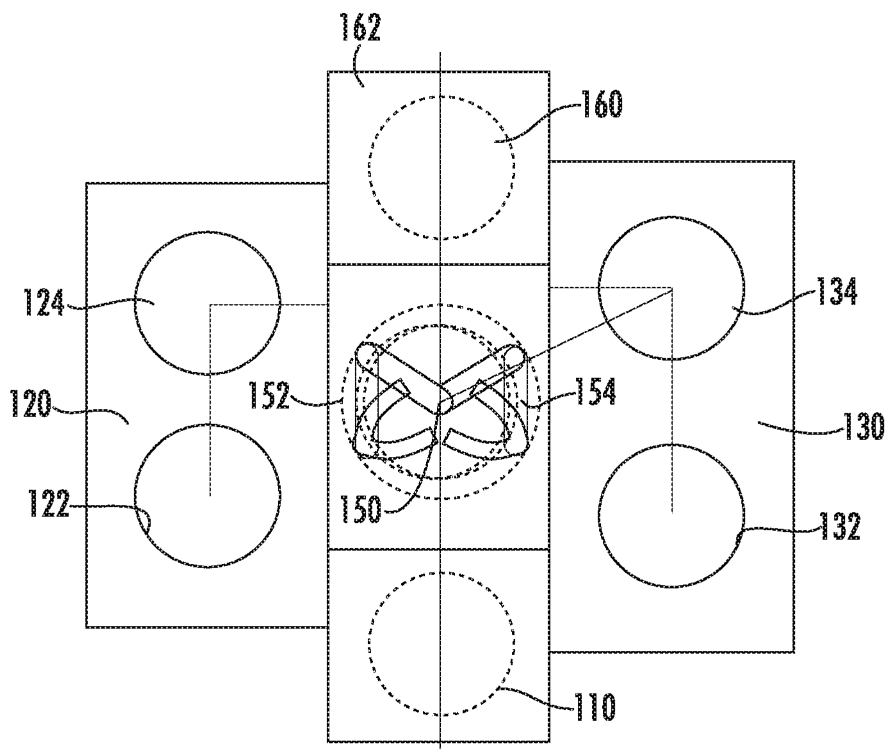

As shown in FIG. 7A, both robot arms 152 and 154 of the rotary robot 150 can be extended to grab a workpiece from the workpiece column 110 in the loadlock chamber 112 using a workpiece blade. For instance, robot arm 152 can be extended to grab a workpiece from workpiece column 110 using workpiece blade 156. Robot arm 154 can be extended to grab a workpiece from workpiece column 110 using workpiece blade 158. As shown in FIG. 7B, the rotary robot 150 can then be operated to retract the robot arms 152 and 154 to a retracted position.

Figure 7C:
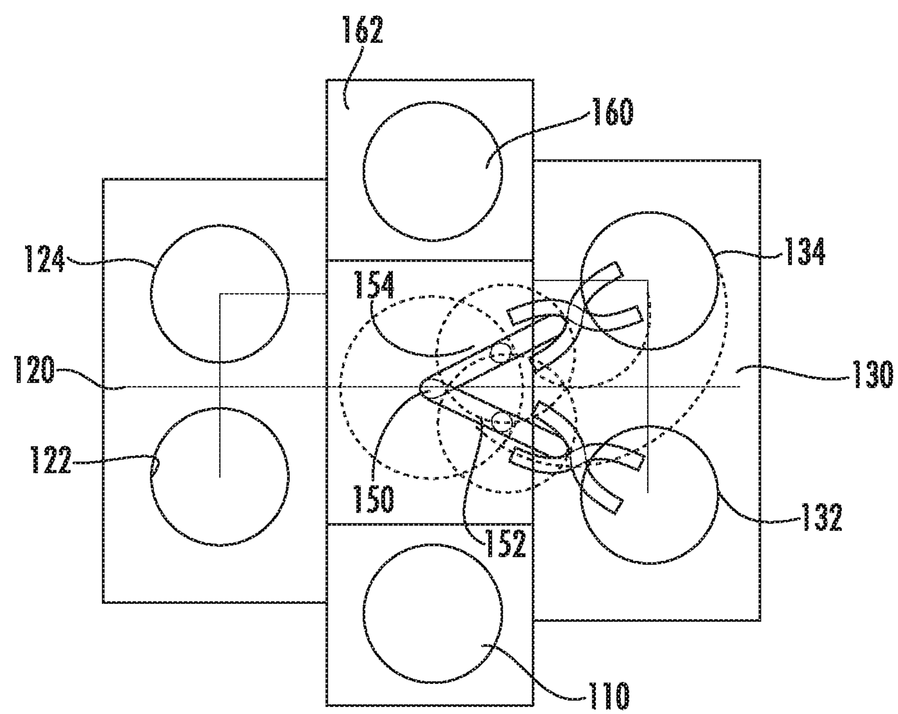
Figure 7D:
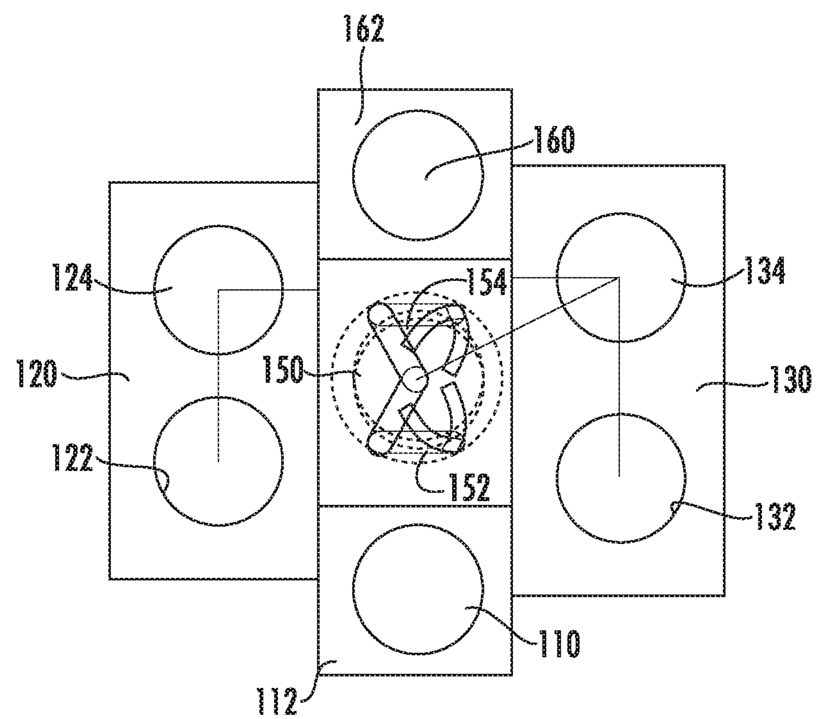

FIG. 7C shows the transfer of workpieces to side-by-side processing stations 132 and 134 in process chamber 130 according to example embodiments of the present disclosure. The first robot arm 152 can be rotated and extended so that a workpiece blade can transfer a workpiece to the first processing station 132. Prior to the actual transfer of the workpiece to the first processing station, a second workpiece blade associated with the first robot arm 152 can grab a workpiece already located on the first processing station 132. The second robot arm 154 can be rotated and extended so that a workpiece blade can be transfer to the second processing station 134. Prior to the actual transfer of the workpiece to the first processing station, a second workpiece blade associated with the second robot arm 154 can grab a workpiece already located on the second processing station 134. In particular embodiments, the first robot arm 152 and the second robot arm 154 can be operated in a scissor motion fashion such that the second robot arm 154 separates from the first robot arm 152. In some embodiments, the robot arms 152 and 154 can simultaneously transfer workpieces to the first processing station 132 and the second processing station 134 respectively.

Once the workpieces that were previously located at processing stations 132 and 134 have been grabbed and the new workpieces have been transferred to the processing stations 132 and 134, the rotary robot 150 can be operated to retract robot arms 152 and 154 to a retracted position. The rotary robot 150 can then be rotated and operated to deliver workpieces to other portions of the system, such as workpiece column 110 in the loadlock chamber 112, the workpiece column 160 in the transfer position 162, or the processing stations 122 and 124 in the process chamber 120.

Figure 8A:
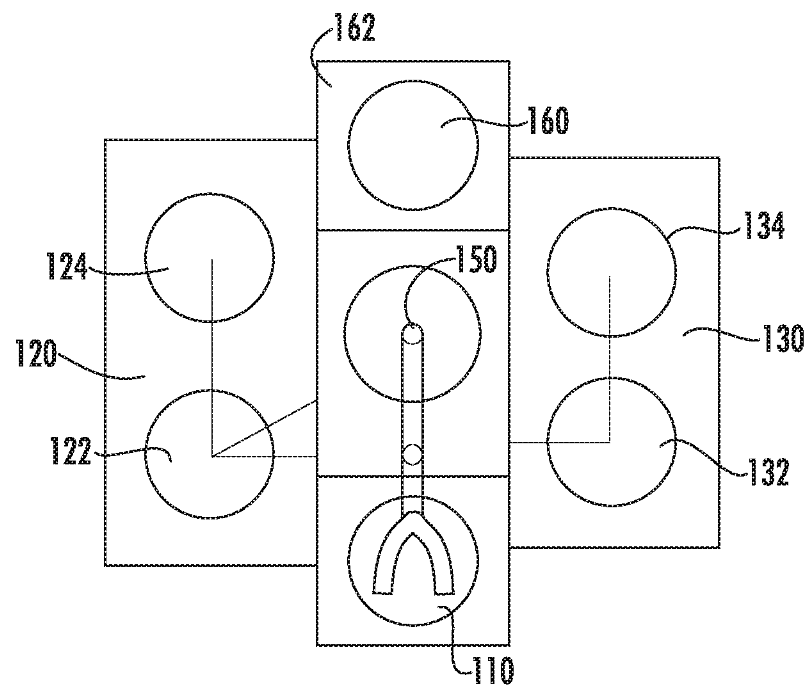
FIGS. 8A and 8B depict an example rotary robot performing a transfer of a plurality of workpieces from a workpiece column to at least two processing stations in a process chamber using a scissor motion according to example embodiments of the present disclosure.
Figure 8B:
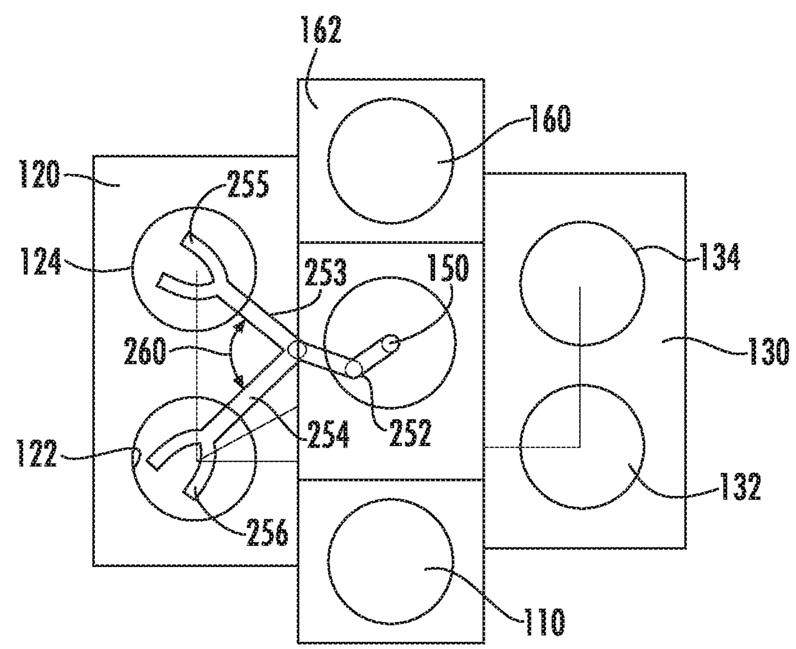

FIGS. 8A and 8B depict the operation of an example a rotary robot 150 according to another example embodiment of the present disclosure. The rotary robot 150 of FIGS. 8A and 4B includes a single primary robot arm 252 and two secondary robot arms 253 and 254 attached to the primary arm 252 at a pivot point on the primary robot arm 252. Each of the secondary robot arms 253 and 254 can include at least one workpiece blade. For instance, secondary robot arm 253 can include workpiece blade 255. Secondary robot arm 254 can include workpiece blade 256. Each workpiece blade 255 and 256 can be configured to grab, hold, and release a workpiece using, for instance, a suitable endeffector. In some embodiments, each of the robot arms secondary 253 and 254 can each include a pair of workpiece blades. The additional workpiece blades can be used, for instance, for workpiece swap.

Referring to FIG. 8A, the rotary robot 150 can be operated to extend the primary robot arm and the secondary robot arms to grab a workpiece from the workpiece column 110 using a workpiece blade. Each secondary arm can grab a workpiece using a suitable workpiece blade. The robot 150 can then retract the primary robot arm and secondary robot arms to a retracted position. The robot 150 can then rotate the primary robot arm and secondary robot arms to a position to deliver the workpieces to, for instance, the first process chamber 120.

As shown in FIG. 8B, the rotary robot 150 can extend the primary robot arm 252. The secondary robot arms 253 and 254 can be caused to move in a scissor motion 260 (e.g., separate from one another) to simultaneously deliver the workpieces to the first processing station 122 and the second processing station 124 in the process chamber 120.

Various mechanisms can be used to operate the secondary arms 253 and 254 in a scissor motion. For instance, in one example, a mechanism (e.g., a dividing member) can be positioned to separate the secondary robot arms 253 and 254 in a scissor motion when the rotary robot extends the primary arm 252. In this way, the extension of the primary robot arm 252 and the secondary robot arms 253 and 254 according to example embodiments can be operated using a single motor. In another example, the rotary robot 150 can include one or more additional motors to independently operate the secondary robot arms 253 and 254 in a scissor motion, different from a motor to operate the primary robot arm 252, to deliver workpieces to the processing stations 122 and 124. In some other embodiments, a mechanism can be positioned to cause the scissor motion of the secondary robot arms 253 and 254 by the rotation angle of the rotary robot 150. As shown in FIGS. 4A and 4B, the secondary arms 253 and 254 can be caused to move in a scissor motion 260 when the rotary robot 150 rotates toward the process chamber 120, but not when the rotary robot 150 rotates toward the workpiece column 110.

In another example implementation, the rotary robot 150 can include a second primary arm (not illustrated). The second primary arm can have two secondary robot arms. Each of the secondary robot arms can include at least one workpiece blade. The secondary robot arms attached to the second primary robot arm can be caused to move in a scissor motion (e.g., separate from one another), and the workpiece blades can simultaneously grab the workpieces already located on the processing stations 122 and 124 in the process chamber 120, prior to the actual transfer of the new workpieces to process chamber 120 by the secondary robot arms 253 and 254 attached to the first primary robot arm 252. In another example, the two primary arms never extend at the same time and can be operated using a single motor.

The above examples of operation of the rotary robot for transferring workpieces in a processing system are provided for purposes of illustration and discussion. Those of ordinary skill in the art, using the disclosures provided herein, will understand that many different modes of operating the rotary robot can be used without deviating from the scope of the present disclosure.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A processing system for processing a plurality of workpieces, the processing system comprising:

a loadlock chamber, the loadlock chamber comprising a workpiece column configured to support a plurality of workpieces in a stacked arrangement;

at least two process chambers, the at least two process chambers having at least two processing stations, each processing station associated with a workpiece support for supporting a workpiece during processing in the process chamber, wherein the at least two process chambers comprise the first process chamber and a second process chamber, each of the first process chamber and the second process chamber comprising at least two process stations, wherein the first process chamber and the second process chamber are disposed in a linear arrangement, the system comprising a transfer position configured to support a plurality of workpieces in a stacked arrangement; and a transfer chamber in process flow communication with the loadlock chamber and the at least two process chambers;

wherein the transfer chamber comprises at least one rotary robot, the at least one rotary robot comprising at least two arms configured to rotate about an axis, the at least one rotary robot configured to transfer a plurality of workpieces from the workpiece column in the loadlock chamber to the at least two processing stations in each of the at least two process chambers, wherein the at least one rotary robot is configured to transfer the plurality of workpieces from the at least two processing stations in the first process chamber to the stacked arrangement in the transfer position;

wherein the at least two processing stations in each of the at least two process chambers are disposed in a linear arrangement;

wherein the at least two arms move in a scissor motion such that a first arm moves as a first part of the scissor motion to transfer a first workpiece located at a first position in the stacked arrangement to a first processing station in the linear arrangement of a first process chamber, and a second arm moves as a second part of the scissor motion to transfer a second workpiece located at a second position in the stacked arrangement to a second processing station in the linear arrangement of the first process chamber.

2. The processing system of claim 1, wherein the first process chamber and the second process chamber are disposed on opposing sides of the transfer chamber such that the rotary robot can transfer the plurality of workpieces among the first process chamber and the second process chamber.

3. The processing system of claim 1, wherein the system comprises a second rotary robot configured to transfer a plurality of workpieces from the stacked arrangement in the transfer position to the at least two processing stations in the second process chamber.

4. The processing system of claim 1, wherein the transfer position is located in the transfer chamber.

5. The processing system of claim 1, wherein the at least two process chambers comprise the first process chamber and a second process chamber disposed on opposing sides of the transfer chamber, the at least two process chambers further comprising a third process chamber disposed in a linear arrangement with the first process chamber and a fourth process chamber disposed in a linear arrangement with the second process chamber such that the third process chamber and the fourth process chamber are disposed on opposing sides of the transfer chamber, wherein each of the first process chamber, second process chamber, third process chamber, and fourth process chamber comprise at least two process stations.

6. The processing system of claim 5, wherein the system further comprises a transfer position configured to support a plurality of workpieces in a stacked arrangement, wherein the at least one rotary robot comprises a first rotary robot configured to transfer a plurality of workpieces from the stacked arrangement in the loadlock chamber to the at least two processing stations in the first process chamber and a second rotary robot configured to transfer a plurality of workpieces from the stacked arrangement in the transfer position to the at least two processing stations in the third process chamber.

7. The processing system of claim 1, wherein at least one of the at least two arms is a primary arm configured to rotate about a pivot point, the primary arm coupled to a plurality of secondary arms, each secondary arm associated with at least one workpiece blade configured to support one of the plurality of workpieces.

8. The processing system of claim 1, wherein the at least one rotary robot is configured to extend the at least two arms and to scissor open a plurality of workpiece blades to transfer the plurality of workpieces to the at least two processing stations in the process chamber.

9. The processing system of claim 8, wherein the at least one rotary robot is configured to extend the at least two arms and to scissor open the plurality of workpiece blades using a single motor.

10. The processing system of claim 1, wherein the at least two arms comprise a first arm having one or more workpiece blades and a second arm comprising one or more workpiece blades.

11. The processing system of claim 10, wherein the first arm is configured to transfer one of the plurality of workpieces from the column in the loadlock chamber to the first processing station in the first process chamber and the second arm is configured to transfer one of the plurality of workpieces from the column in the loadlock chamber to the second processing station in the first process chamber.

12. A processing system for processing workpieces, comprising:

a workpiece column configured to support a plurality of workpieces in a stacked arrangement;

a first rotary robot;

a second rotary robot;

a first process chamber;

a second process chamber, the second process chamber disposed in a linear arrangement with the first process chamber;

the first rotary robot configured to transfer the plurality of workpieces from the workpiece column to at least two processing stations in the first process chamber, the first rotary robot configured to transfer the plurality of workpieces from the first process chamber to a transfer position, wherein the first rotary robot is configured to transfer the plurality of workpieces from the first process chamber to a stacked arrangement in the transfer position;

the second rotary robot configured to transfer the plurality of workpieces from the transfer position to the second process chamber;

wherein the first rotary robot comprises at least two arms configured to rotate about an axis, wherein the at least two processing stations in the first process chambers are disposed in a linear arrangement;

wherein the at least two arms move in a scissor motion such that a first arm moves as a first part of the scissor motion to transfer a first workpiece located at a first position in the stacked arrangement to a first processing station in the linear arrangement of the first process chamber, and a second arm moves as a second part of the scissor motion to transfer a second workpiece located at a second position in the stacked arrangement to a second processing station in the linear arrangement of the first process chamber.

* * * * *